(12) United States Patent
Jee (10) Patent No.: US 9,429,239 B2
(45) Date of Patent: Aug. 30, 2016

(54) GATE VALVE

(71) Applicant: PRESYS CO.,LTD., Gyeonggi-do (KR)

(72) Inventor: Shin-Young Jee, Gyeonggi-do (KR)

(73) Assignee: PRESYS. CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/390,554

(22) PCT Filed: Apr. 8, 2013

(86) PCT No.: PCT/KR2013/002915
§ 371 (c)(1),
(2) Date: Oct. 3, 2014

(87) PCT Pub. No.: WO2013/151403
PCT Pub. Date: Oct. 10, 2013

(65) Prior Publication Data
US 2015/0069282 A1    Mar. 12, 2015

(30) Foreign Application Priority Data

Apr. 6, 2012 (KR) .......................... 10-2012-0035931

(51) Int. Cl.
| | |
|---|---|
| *F16K 3/02* | (2006.01) |
| *F16K 3/18* | (2006.01) |
| *F16K 3/316* | (2006.01) |
| *F16K 41/10* | (2006.01) |
| *F16K 51/02* | (2006.01) |
| *H01L 21/67* | (2006.01) |

(52) U.S. Cl.
CPC ............. *F16K 3/0281* (2013.01); *F16K 3/182* (2013.01); *F16K 3/316* (2013.01); *F16K 41/10* (2013.01); *F16K 51/02* (2013.01); *H01L 21/67126* (2013.01)

(58) Field of Classification Search
CPC .......... F16K 51/02; F16K 3/184; F16K 3/18; F16K 3/182; F16K 3/0281; F16K 41/10; H01L 21/67126
USPC ..................... 251/158, 193, 203, 335.3, 204, 251/194–196
See application file for complete search history.

(56) References Cited

U.S. PATENT DOCUMENTS

| | | | |
|---|---|---|---|
| 3,321,174 A * | 5/1967 | Schertler | ................... F16K 3/16 251/158 |
| 4,721,282 A | 1/1988 | Shawver et al. | |
| 5,415,376 A * | 5/1995 | Ito | .............................. F16K 3/18 251/158 |

(Continued)

FOREIGN PATENT DOCUMENTS

| | | |
|---|---|---|
| JP | 05-087258 | 4/1993 |
| JP | 05-196150 | 8/1993 |
| KR | 10-1071955 | 10/2011 |

*Primary Examiner* — Kevin Murphy
*Assistant Examiner* — David Colon Morales
(74) *Attorney, Agent, or Firm* — Davis, Malm & D'Agostine, P.C.

(57) ABSTRACT

The present invention disclosed herein relates to a gate valve, in which only one driving unit is provided, thus obtaining a reliable structure, and although either a closing operation may be performed in such a way that the valve plate is moved from an opening position to an intermediate portion in a vertical direction, and then from its intermediate position to a closing position in a horizontal direction which is vertical with respect to the vertical direction, or an opening operation may be performed in the sequence reverse to the above mentioned sequence.

5 Claims, 7 Drawing Sheets

(56) References Cited

U.S. PATENT DOCUMENTS

| | | | | |
|---|---|---|---|---|
| 5,626,324 A * | 5/1997 | Nakamura | F16K 3/18 | 251/158 |
| 5,755,255 A * | 5/1998 | Iwabuchi | F16K 3/184 | 137/341 |
| 5,769,952 A * | 6/1998 | Komino | C23C 16/4404 | 118/719 |
| 6,056,267 A * | 5/2000 | Schneider | F16K 3/184 | 251/193 |
| 6,082,706 A * | 7/2000 | Irie | F16K 3/184 | 251/158 |
| 6,283,445 B1 * | 9/2001 | Tamura | F16K 3/18 | 251/193 |
| 6,390,448 B1 * | 5/2002 | Kroeker | F16K 3/188 | 251/167 |
| 6,390,449 B1 * | 5/2002 | Ishigaki | F16K 51/02 | 251/193 |
| 6,488,262 B1 * | 12/2002 | Oka | F16K 3/182 | 251/193 |
| 6,966,538 B2 * | 11/2005 | Hayashi | F16K 3/16 | 251/187 |
| 7,066,443 B2 * | 6/2006 | Ishigaki | F16K 3/10 | 251/195 |
| 7,100,892 B2 * | 9/2006 | Iwabuchi | F16K 51/02 | 251/187 |
| 7,198,251 B2 * | 4/2007 | Kondoh | F16K 51/02 | 251/193 |
| 7,441,747 B2 * | 10/2008 | Chen | F16K 3/0254 | 251/193 |
| 7,766,305 B2 | 8/2010 | Kim | | |
| 2011/0057136 A1 * | 3/2011 | Ehrne | F16K 3/182 | 251/319 |

* cited by examiner

GATE VALVE

TECHNICAL FIELD

The present invention relates to a gate valve, and in particular to a gate valve 100 comprising a valve blade 120 which comes into close contact with a valve seat 111 formed around an opening 112 in a valve housing 110 and is configured to close the opening 112 from inside; a valve rod 130 which is connected to the valve blade 120 and sealingly protrudes by way of a bellows 131 from the inside of the valve housing 110 to the outside and which moves in upward and downward direction and in a horizontal direction; a guide housing 140 which comprises an L-motion block guide groove 142 on both inner sides, further comprising an upward and downward driving section groove 143 which is connected to an outer side of the valve housing 110, formed upward and downward, and an opening and closing driving section groove 144 which is horizontally formed in series in the closing direction "C" on top of the upward and downward driving section groove 143; an L-motion block 150, connected to the valve rod 130, which installs on both inner sides, a guide roller 151 which is inserted and driven into the L-motion block guide groove 142; a driving block 160 which is connected respectively to an upper side and a lower side of the L-motion block 150 by way of at least one link 155; a tensile elasticity unit 170, at least more than one of which are installed between the L-motion block 150 and the driving block 160; and an upward and downward driving unit 180 which is configured to drive the driving block 160 upward and downward.

BACKGROUND ART

The present invention is directed to a gate valve which is configured to open or close an IC (Integrated Circuit) or a transfer passage which transfer processed things such as the parts of the IC from one vacuum process chamber to another vacuum process chamber, or open or close a flow passage of a fluid such as compressed fluid, gas, etc. or an exhaust gas flow passage.

Generally, in an apparatus for processing a semiconductor wafer or a liquid crystal substrate, the semiconductor wafer or the liquid crystal substrate is inserted or withdrawn from a variety of process chambers by way of a communication passageway, wherein a gate valve is typically installed in order to open or close it.

As an embodied example of the gate valve, many kinds of gate valves are disclosed. As an existing invention of such a gate valve, which is characterized in that a valve desk in a valve box is configured to freely move to a portion, and recedes from or comes into close contact with a valve seat by means of a valve rod which sealingly protrudes out of the valve box by means of an operation unit installed in the valve box. The gate valve allows the valve desk to be pressed again the valve seat in the valve box by inclined movement of the valve rod at the time the movement of the valve rod is almost finished. The operation unit may be configured to connect the piston rod and the valve rod of the piston-cylinder apparatus with the aid of the roller and the slanted long hole configured to guide the roller, or may be configured to connect their ends with the aid of a slanted link which freely pivots rotational movements.

Figure 1:
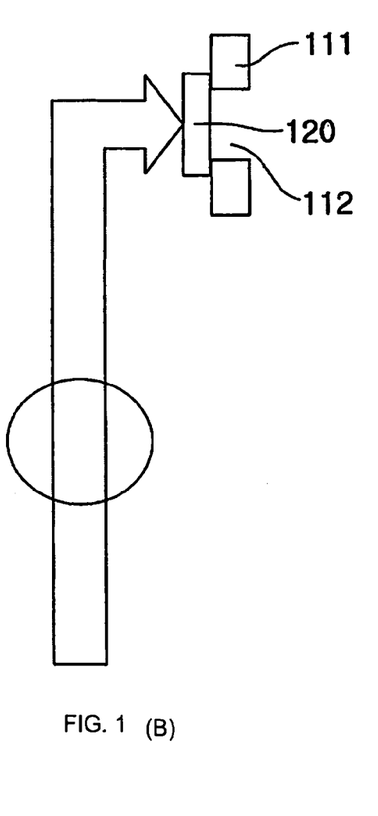
FIG. 1 is a schematic view illustrating a comparison of an operative passageway of a related gate valve.

As illustrated in FIG. 1a, the related gate valve was characterized in that the valve desk operated along a predetermined operation passageway which was slightly slanted with respect to upward and downward directions and a horizontal direction, so there was disadvantages that conflict may happen among a variety of components installed in the interior of the gate valve or that impurities produced due to mechanical abrasions could be mixed into the process chamber.

After structure of the gate valve which had a slanted, operative passageway as such was improved, as illustrated in FIG. 1b, the improved construction was proposed, in order to be able to be operated horizontally to the closing position after being operated to upper direction when it is closed.

The vacuum valve of the above said construction comprises a wall with a valve opening surrounded by a valve seat; at least one valve plate which is arranged in a vacuum region of the vacuum valve (here, the valve plate may be moved from an opening position to an intermediate position in a vertical direction, and it may be moved to from its intermediate position to a closing position in a horizontal direction which is at a right angle with respect to the vertical direction); at least one valve rod which has a valve plate (the valve rod may be guided out of the vacuum region of the vacuum valve and may move in a vertical direction or a horizontal direction wherein the vertical direction is in parallel with respect to the vertical axis of the valve rod); and a vertical drive apparatus and a horizontal drive apparatus which are arranged outside the vacuum region of the vacuum valve (the valve rod may be moved in a vertical direction or a horizontal direction by means of the above apparatuses so as to move the valve plate).

The vacuum valve of the above said construction was very efficient in its operative passageway; however, for such an operation, since it requires a vertical drive apparatus and a horizontal drive apparatus, it leaded to problems such as complicated structure, manufacturing cost. In addition, To perform accurate opening and closing operations, the vertical drive apparatus and the horizontal drive apparatus should cooperate and operate on accurate timing in set operation sequence, which leaded to a problem that more complicated components are necessary for this closely coordinated operation.

DISCLOSURE OF INVENTION

Accordingly, it is an object of the present invention to provide a gate valve which is made so as to overcome the problems of the existing art and is characterized in that only one driving unit is provided, thus obtaining a reliable structure, and a closing operation may be performed in such a way that the valve plate is moved from an opening position to an intermediate portion in a vertical direction, and then is moved from its intermediate position to a closing position in a horizontal direction which is at a right angle with respect to the vertical direction or an opening operation may be performed in the sequence reverse to the above mentioned sequence. It is possible to prevent interference with a variety of components installed in the interior of the gate valve and prevent impurities produced by mechanical abrasion from entering into the process chamber, thus obtaining efficient operations.

To achieve the above objects, there is provided a gate valve, comprising a valve blade 120 which comes into close contact with a valve seat 111 formed around an opening 112 in a valve housing 10 and is configured to close the opening 112 from the inside; a valve rod 130 which is connected to the valve blade 120 and sealingly protrudes by way of a bellows 131 from the inside of the valve housing 110 to the outside and moves in the upward and downward direction and in a horizontal direction; a guide housing 140, further comprising an upward and downward driving section groove 143, formed upward and downward, which is connected to an outer side of the valve housing 110, and an L-motion block guide groove 142 which comprises an opening and closing driving section groove 144 which is formed horizontally in series in a closing direction "C" on top of the upward and downward driving section groove 143; an L-motion block 150 comprising a guide roller 151 which is connected to the valve rod 130, and on both sides, inserted and driven into the L-motion block guide groove 142; a driving block 160 which is connected respectively to an upper side and an lower side of the L-motion block 150 by way of at least more than one link 155; a tensile elasticity unit 170, at least more than one of which are installed between the L-motion block 150 and the driving block 160; and an upward and downward driving unit 180 which is configured to drive the driving block 160 upward and downward.

In addition, the gate valve has feature wherein there are further provided an lower side protrusion 161 which is formed at an lower side of the driving block 160 and is configured to contact-support an lower surface of the L-motion block 150 in a closed state; and a driving block guide 160 which is installed in the driving block 166 and is engaged to a driving block guide rail 165 installed at an inner side of the guide housing 140 and is configured to allow the driving block 160 to move only in upward and downward directions.

In addition, the gate valve has feature wherein the tensile elasticity unit 170 comprises a first spring pin 154 installed in a spring pin through hole 153 formed in at least two portions of the upper side and the lower side of the L-motion block 150; a second spring pin 164 installed in a spring pin engaging hole 163 formed in at least two portions of the upper side and the lower side of the driving block 160; and a spring 171 installed at both ends of the first spring pin 154 and at both ends of the second spring pin 164, wherein a curved portion "r" having a curvature, which connects the upward and downward driving section groove 143 and the opening and closing driving section groove 144, is formed on an outer circumferential surface of the section.

In addition, the gate valve has feature wherein the upward and downward driving unit 180 comprises a piston 182 which is installed in the interior of the cylinder 181, moving upwards and downwards by means of pneumatic, and on the upper side of which a driving rod 183 which is connected to the driving block 160.

Advantageous Effects

The present invention has advantages that only one driving unit is provided, thus obtaining a reliable structure, and although either a closing operation may be performed in such a way that the valve plate is moved from an opening position to an intermediate portion in a vertical direction, and then from its intermediate position to a closing position in a horizontal direction which is vertical with respect to the vertical direction, or an opening operation may be performed in the sequence reverse to the above mentioned sequence, it is possible to prevent any interference with a variety of components installed in the interior of the gate valve and prevent the impurities produced due to mechanical abrasion from inflowing in the process chamber, thus obtaining efficient operations.

BEST MODES FOR CARRYING OUT THE INVENTION

The gate valve according to an exemplary embodiment of the present invention will be described with reference to the accompanying drawings. In the drawings, it is noted that the same components or parts will be given the same reference numbers. In the course of the description of the present invention, the detailed descriptions on the related functions or construction will be omitted in order to prevent the subject matters of the present invention from becoming ambiguous.

Figure 2:
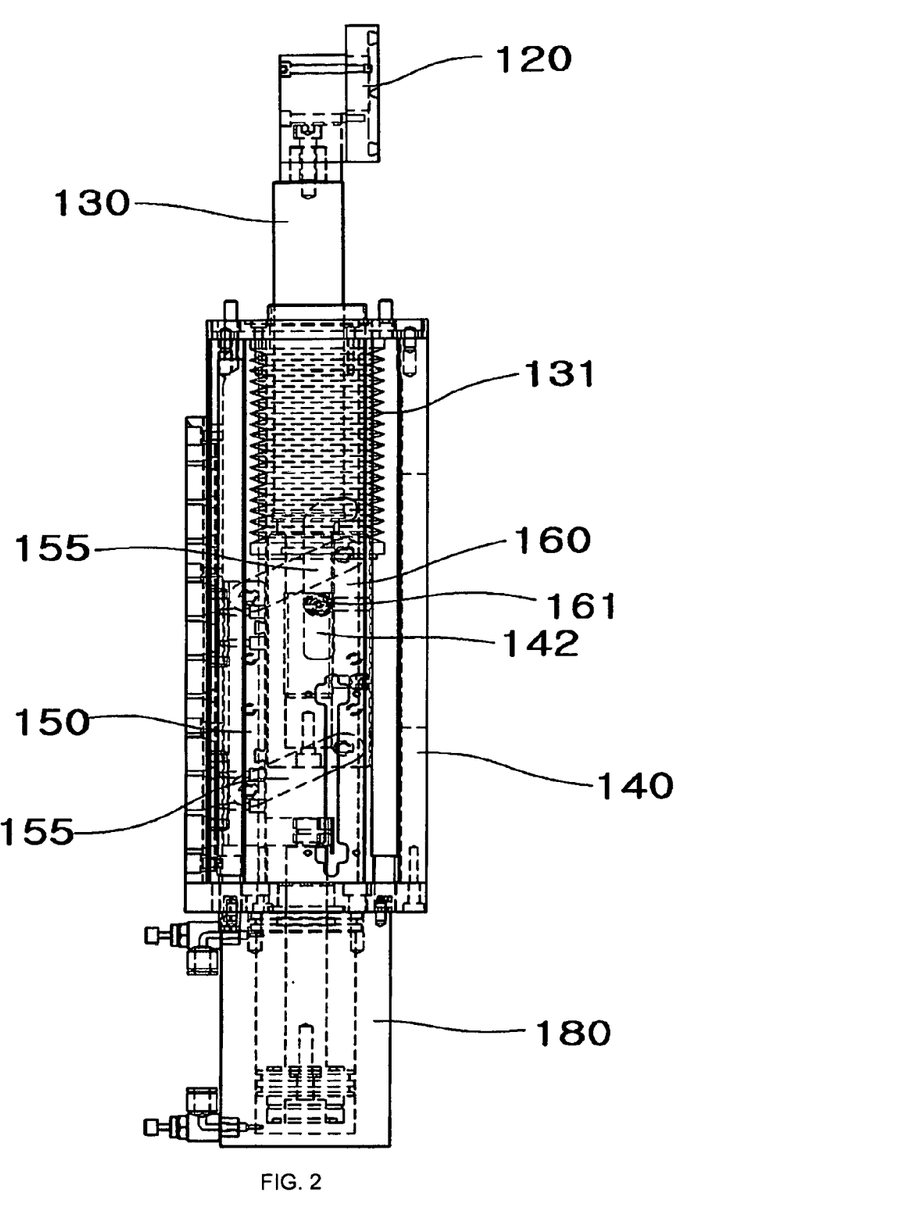
FIG. 2 is a side projection view illustrating an exterior and an interior of a gate valve according to an exemplary embodiment of the present invention.
Figure 3:
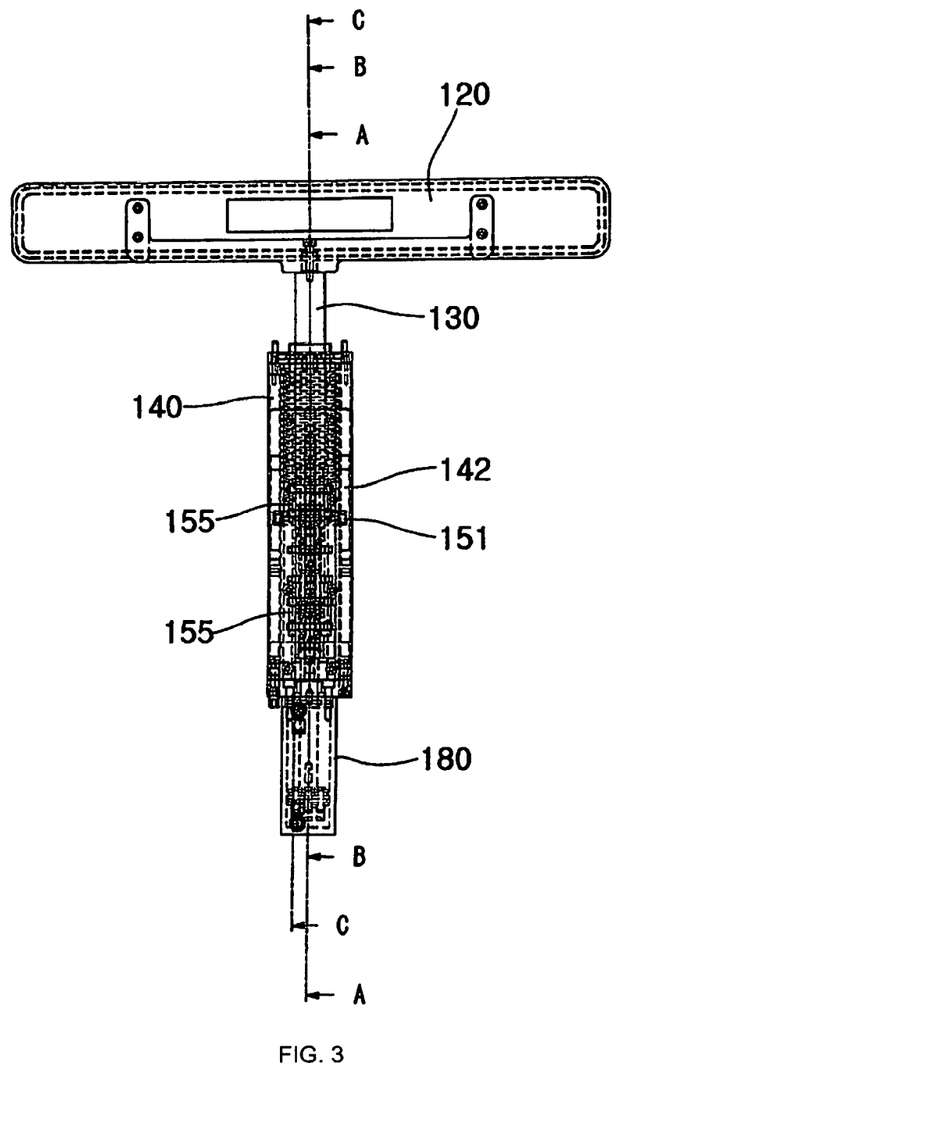
FIG. 3 is a front projection view illustrating an exterior and an interior of a gate valve according an exemplary embodiment of the present invention.
Figure 5:
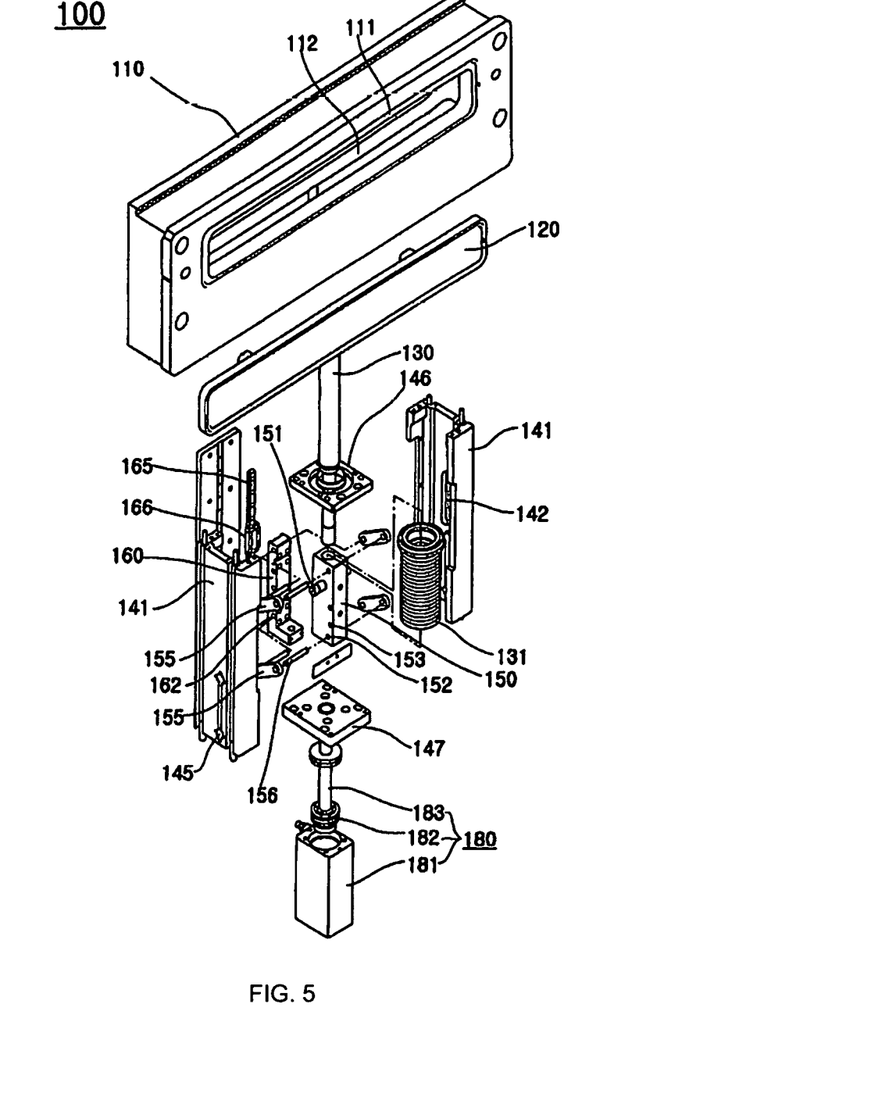
FIG. 5 is a disassembled perspective view illustrating an engagement of major components of a gate valve according to an exemplary embodiment of the present invention.

The gate valve according to the present invention, as illustrated in FIGS. 2 and 5, comprises a valve blade 120, a valve rod 130, a guide housing 140, an L-motion block 150, a driving block 160, a tensile elasticity unit 170, and an upward and downward diving unit 180.

Firstly, the valve blade 120 will be described. The valve blade, as illustrated in FIG. 5, comes into contact with a valve seat 111 formed around an opening 112 in a valve housing 110 and has a function of closing the opening 112 from inside. The opening and closing operations of the gate valve 100 of the present invention are performed in such a way that the opening 112 is opened or closed by means of the valve blade 120.

Figure 4:
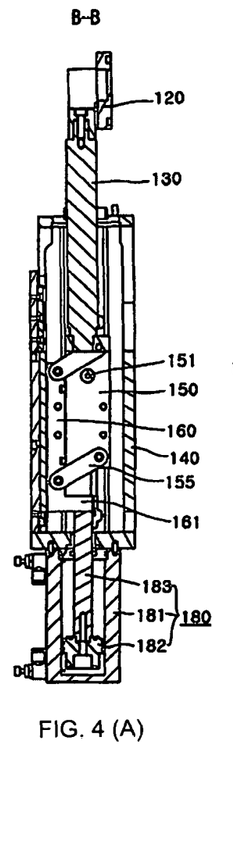
FIG. 4 is a side, cross sectional view illustrating the side and cross-sectional view of each portion of a gate valve according to an exemplary embodiment of the present invention.

Next, the valve rod 130 will be described. The valve rod 130, as illustrated in FIG. 5, is connected to the valve blade 120 and sealingly protrudes from the interior of the valve housing 110 to the outside by way of a bellows 131 for thereby performing upward and downward movements and a horizontal movement as illustrated in FIGS. 2 and 4.

Next, the guide housing 140 will be described. The guide housing 140, as illustrated in FIGS. 2 and 4, is connected to an outer side of the valve housing 110 and has a function of protecting and accommodating the major components of the L-motion block 150, the driving block 160, etc. At both inner surfaces of the guide housing 140, there is provided an L-motion block guide groove 142 which includes an upward and downward driving section groove 143 which is formed upward and downward, and an opening and closing driving section groove 144 which is horizontally formed in series in a closing direction "C" on the top of the upward and downward driving section groove 143. In this case, the L-motion block guide groove 142 is formed in an upside down "L"-shape, namely, it is formed in a predetermines shape which is similar to a "r"-shape. Meanwhile, it is preferred that a curved portion "r" having a curvature as illustrated in FIG. 4c is formed on an outer circumferential surface of the section where connects the upward and downward driving section groove 143 and the opening and closing driving section groove 144 of the L-motion block guide groove 142 for thereby obtaining reliable operations.

Meanwhile, the exemplary embodiment for constituting the guide housing 140 may be performed by way of a variety of embodiments including an integrated formation, etc.; however as illustrated in FIG. 5, it is preferred to manufacture in such a way to engage the side surface guide plate 141, the housing upper plate 146 and the housing lower plate 147. In this case, it is preferred that the L-motion block guide groove 142 is formed inside an inner surface of the side surface guide plate 141.

Next, the L-motion block 150 will be described. The L-motion block 150, as illustrated in FIGS. 4 and 5, comprises a guide roller 151 which is connected to the valve rod 130 and is inserted into the L-motion block guide groove 142 at both side surfaces and is driven.

Figure 6:
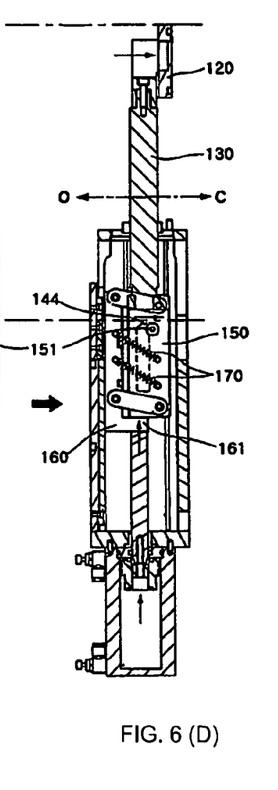
FIG. 6 is procedure procedural view of a gate valve according to an exemplary embodiment of the present invention.
Figure 7:
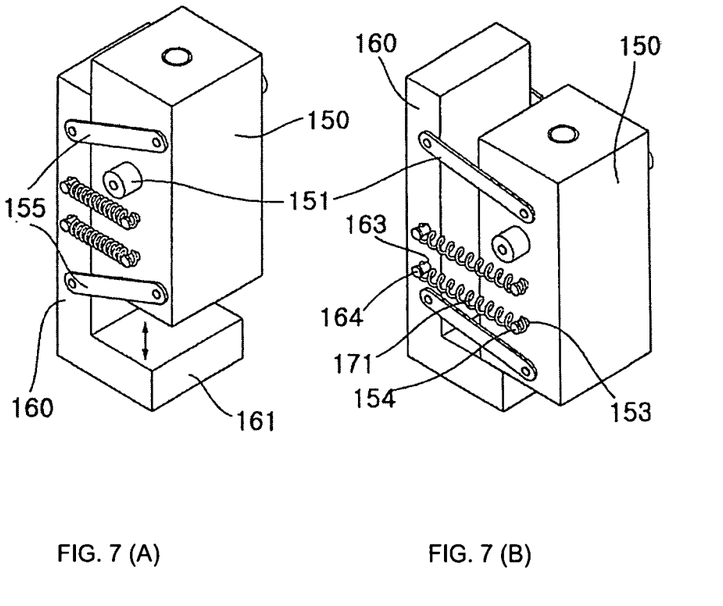
FIG. 7 is a perspective view illustrating an operation procedure and a closed state of a driving block and an L-motion block of a gate valve according to an exemplary embodiment of the present invention.

Next, the driving block 160 will be described. The driving block 160, as illustrated in FIGS. 5 and 6, is connected to each of the upper side and lower side of the L-motion block 150 with more than at least one link 155. With the aid of the construction that it is connected to each of the upper side and the lower side by way of the link 155, the L-motion block 150 and the driving block 160 may come into contact with each other or maybe separated from each other while keeping a parallel state between them as illustrated in FIGS. 6 and 7.

In this case, as a way of constituting the link 155, there may be a variety of exemplary embodiments. As for an exemplary embodiment of the link 155 as illustrated in FIGS. 5 and 7, it is preferred that the link 156 is inserted in an link pin through hole 152 formed in an lateral direction in the upper side and the lower side of the L-motion block 150, respectively, and an link pin 156 may be inserted in an link pin engaging hole 162 formed in an lateral direction in the upper side and the lower side of the driving block 160, respectively; thereafter, the driving block 160, which is placed on the place corresponding to the link pin 15 of the L motion block 150.

Meanwhile, it is preferred that an lower side protrusion 161, as illustrated in FIGS. 4 and 5, is formed at the bottom of the driving block 160 so as to contact-support the lower surface of the L-motion block 150, thus surely supporting the L-motion block 150 in the closed state, whereby stably maintaining the closed state.

In addition, during the opening operation a strong tensile force may be generated by the link 155 between the L-motion block 150 and the driving block 155, which may cause operational error because the driving block 160 moves in the direction of the L-motion block 150, so an error may occur during the operation. In order to prevent such an error, as illustrated in FIGS. 4b and 5, it is preferred that a driving block guide 166 may be further installed in the driving block 160, so that it is engaged to a driving block guide rail 165 installed at an inner side of the guide housing 140, and the driving block 160 may be driven only in the upward and downward directions; therefore, to basically prevent any error during the operations which used to happen in the related art because the driving block 160 moves in lateral directions.

Next, the tensile elasticity unit 170 will be described. At least one tensile elasticity unit 170, as illustrated in FIGS. 6 and 7, is installed between the L-motion block 150 and the driving block 160, thereby providing a tensile force between the L-motion block 150 and the driving block 160. With the aid of the provision of the tensile elasticity unit 170, the operation that the L-motion block 150 horizontally moves in the direction of the driving block 160 by the descending operation of the driving block 160 may be more effectively performed at the initial stage of the opening operation.

In this case, as a way for constituting the tensile elasticity unit 170, there are a variety of embodiments. According to an example for constituting the tensile elasticity unit 170, as illustrated in FIGS. 6 and 7, there are further provided a first spring pin 154 installed in a spring pin through hole 153 formed in at least two portions of the upper side and the lower side of the L-motion block 150, a second spring pin 164 installed in a spring pin engaging hole 163 formed in at least two portions of the upper side and the lower side of the driving block 160, and a spring 171 installed at both ends of the first spring pin 154 and at both ends of the second spring pin 164.

Next, the upward and downward driving unit 180 will be described. Here, the upward and downward driving unit 180 may be driven in upward and downward directions. As a way for constituting the upward and downward driving unit 180, there may be a variety of embodiments. As an exemplary embodiment for constituting the upward and downward driving unit 180, as illustrated in FIGS. 4 and 5, it is preferred that there is further provided a piston 182 which is installed in the interior of the cylinder 181 and is driven by pneumatic in upward and downward directions and includes at its top a driving rod 183 connected to the driving block 160. In this case, it is preferred that the cylinder 181 is typically engaged to the housing lower plate 147, so the gate valve 100 of the present invention may be easily disassembled or assembled for the sake of maintenance or repair.

The operations of the gate valve 100 according to an exemplary embodiment of the present invention will be described.

The closing procedure of the gate valve 100 will be first described.

The closing procedure starts in the fully opened state as illustrated in FIG. 7a (in FIG. 7, it should be noted that the valve housing 110 is not shown in the drawings so as to clearly show the major components). As illustrated in FIG. 7b, the upward and downward driving unit 180 ascends, thus allowing the driving block 160 to ascend. In this case, since the guide roller 151 is positioned in the upward and downward driving section groove 143 of the L-motion block guide groove 142, the L-motion block ascends receiving a driving force from the driving block 160 with the aid of the link 155.

Next, as illustrated in FIG. 6c, when the L-motion block ascends up to the highest ascent position (intermediate position), and when the guide roller 151 arrives at a curved portion "r" of the L-motion block guide groove 142, the driving block 160 may ascend further.

By means of the more ascending operation of the driving block 160, the L-motion block 150, as illustrated in FIG. 6d, performs a closing operation wherein the guide roller 151 is guided by the opening and closing driving section groove 144 of the L-motion block guide groove 142, and recedes from the driving block 160 while keeping a balanced state with respect to the driving block 160 by means of the link 155, and moves horizontally in the closing direction "c" as illustrated in FIG. 6.

Throughout the above-described whole closing operations, the L-motion block 150, as illustrated in FIG. 1b, operates along a passageway which has an upside down "L" shape, or more specifically a predetermined shape which is similar to a "r"-shape, and the valve blade 120, as illustrated in FIG. 1b, connected to the L-motion block 150 by way of the valve rod 130 operates along a passageway which has an upside down "L" shape, or more specifically a predetermined shape which is similar to a "r"-shape; as a final result, it is possible to prevent any interference with a variety of components installed in the interior of the gate valve and any inflow of the impurities, produced due to mechanical abrasion, into the process chamber.

Meanwhile, the opening procedure of the gate valve 100 may be performed in a reverse sequence to the closing procedure of the gate valve 100. In this case, with the aid of the tensile elasticity unit 170, the L-motion block 150 may be more reliably moved in the direction of the driving block 160 by means of the descending operation of the driving block 160 in the starting stage of the opening procedure.

Preferred embodiments have been disclosed in the drawings and specification. Specific terms have been used herein. However, the specific terms have been used not to limit meanings or the scope of the present invention disclosed in claims, but to merely describe the present invention. Accordingly, those skilled in the art may understand that various modifications and changes may be made thereto. Therefore, the scope of the present invention should be defined by the appended claims.

The invention claimed is:

1. A gate valve, comprising:
   a valve blade 120 which comes into close contact with a valve seat 111 formed around an opening 112 in a valve housing 110 and is configured to close the opening 112 from an inside of the valve housing 110;
   a valve rod 130 which is connected to the valve blade 120 and sealingly protrudes by way of a bellows 131 from the inside of the valve housing 110 to an outside of the valve housing and which moves in an upward and a downward direction and in a horizontal direction;
   a guide housing 140, comprising an upward and downward driving section groove 143 which is connected to an outer side of the valve housing 110, formed upward and downward, and an L-motion block guide groove 142 which comprises an opening and closing driving section groove 144 that is horizontally formed in series with the upward and downward driving section groove 143 in a horizontal closing direction "C";
   an L-motion block 150, comprising a guide roller 151, which is connected to the valve rod 130, and at both sides of which a guide roller 151 is inserted and driven into the L-motion block guide groove 142;
   a driving block 160 which is connected to the L-motion Block 150 through a plurality of links 155, wherein more than one link 155 is connected on an upper side and a lower side of the L-motion block 150, respectively;
   a tensile elasticity means 170, more than one of which are installed between the L-motion block 150 and the driving block 160; and
   an upward and downward driving unit 180 which is configured to drive the driving block 160 upwards and downwards.

2. The gate valve of claim 1, further comprising:
   a lower side protrusion 161 which is formed at an lower side of the driving block 160 and is configured to contact-support bottom of the L-motion block 150 in a closed state; and
   a driving block guide 166 which is installed on the driving block 160 and is engaged to a driving block guide rail 165 installed at an inner side of the guide housing 140 and thereby, is configured to allow the driving block 160 to move only in the upward and downward directions.

3. The gate valve of claim 1, wherein the tensile elasticity means 170 comprises:
   a first spring pin 154 which is installed in a spring pin through hole 153 formed in at least two portions of the upper side and the lower side of the L-motion block 150;
   a second spring pin 164 which is installed in a spring pin engaging hole 163 formed in at least two portions of the upper side and the lower side of the driving block 160;
   a spring 171 which is installed at both ends of the first spring pin 154 and at both ends of the second spring pin 164,
   furthermore, wherein a curved portion "r" having a curvature which is formed on an outer circumferential surface of the section which connects the upward and downward driving section groove 143 and the opening and closing driving section groove 144.

4. The gate valve of claim 1, wherein the upward and downward driving unit 180 comprises a piston 182 which is installed in an interior of a cylinder 181, moving upwards and downwards by means of a pneumatic force, and on the upper side of which a driving rod 183 is connected.

5. The gate valve of claim 1, further comprising:
   a lower side protrusion 161 which is formed at the lower side of the driving block 160 and is configured to contact-support an lower surface of the L-motion block 150 in a closed state; and
   a driving block guide 166 which is installed on the driving block 160 and is engaged to a driving block guide rail 165 installed at an inner side of the guide housing 140, configured to allow the driving block 160 to move only in the upward and downward directions;
   wherein the tensile elasticity means 170 comprises:
      a first spring pin 154 installed in a spring pin through hole 153 formed in at least two portions of the upper side and the lower side of the L-motion block 150;
      a second spring pin 164 installed in a spring pin engaging hole 163 formed in at least two portions of the upper side and the lower side of the driving block 160; and
      a spring 171 installed at both ends of the first spring pin 154 and at both ends of the second spring pin 164,
   wherein a curved portion "r" having a curvature is formed on an outer circumferential surface of the section which connects the upward and downward driving section groove 143 and the opening and closing driving section groove 144, and
   wherein the upward and downward driving unit 180 further comprises a piston 182 which is installed in an interior of a cylinder 181, moving upward and downward by a pneumatic force and on an upper side of which a driving rod 183 is connected.

* * * * *